United States Patent
Chang et al.

(10) Patent No.: US 9,418,849 B2
(45) Date of Patent: Aug. 16, 2016

(54) CAVITY STRUCTURE USING PATTERNED SACRIFICIAL LAYER

(71) Applicant: Taiwan Semiconductor Manufacturing Company, Ltd., Hsin-Chu (TW)

(72) Inventors: Kuei-Sung Chang, Kaohsiung (TW); Yi Heng Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 27 days.

(21) Appl. No.: 13/911,594

(22) Filed: Jun. 6, 2013

(65) Prior Publication Data

US 2014/0361412 A1    Dec. 11, 2014

(51) Int. Cl.
*H01L 21/00* (2006.01)
*H01L 21/033* (2006.01)
*B81C 1/00* (2006.01)

(52) U.S. Cl.
CPC ........ *H01L 21/0337* (2013.01); *B81C 1/00047* (2013.01); *B81B 2203/0315* (2013.01)

(58) Field of Classification Search
None
See application file for complete search history.

(56) References Cited

U.S. PATENT DOCUMENTS

| 7,625,603 B2* | 12/2009 | Partridge et al. ......... 427/255.15 |
| 7,824,943 B2* | 11/2010 | Lutz ..................... B81B 3/0021 |
| | | 257/E21.192 |
| 2007/0281387 A1 | 12/2007 | Lutz et al. |
| 2012/0043626 A1* | 2/2012 | Lin ........................ H01L 29/84 |
| | | 257/415 |
| 2012/0181637 A1* | 7/2012 | Shu et al. ..................... 257/415 |

FOREIGN PATENT DOCUMENTS

| TW | 201037772 | 10/2010 |
| TW | 201250560 | 12/2012 |

* cited by examiner

*Primary Examiner* — Benjamin Sandvik
*Assistant Examiner* — Herve Assouman
(74) *Attorney, Agent, or Firm* — Slater Matsil, LLP

(57) ABSTRACT

A method includes forming a sacrificial layer over a bottom substrate. The sacrificial layer is patterned based on a desired etching distance. A top layer is formed over the sacrificial layer. At least one release hole is formed through the top layer. The sacrificial layer is etched through the at least one release hole.

20 Claims, 10 Drawing Sheets

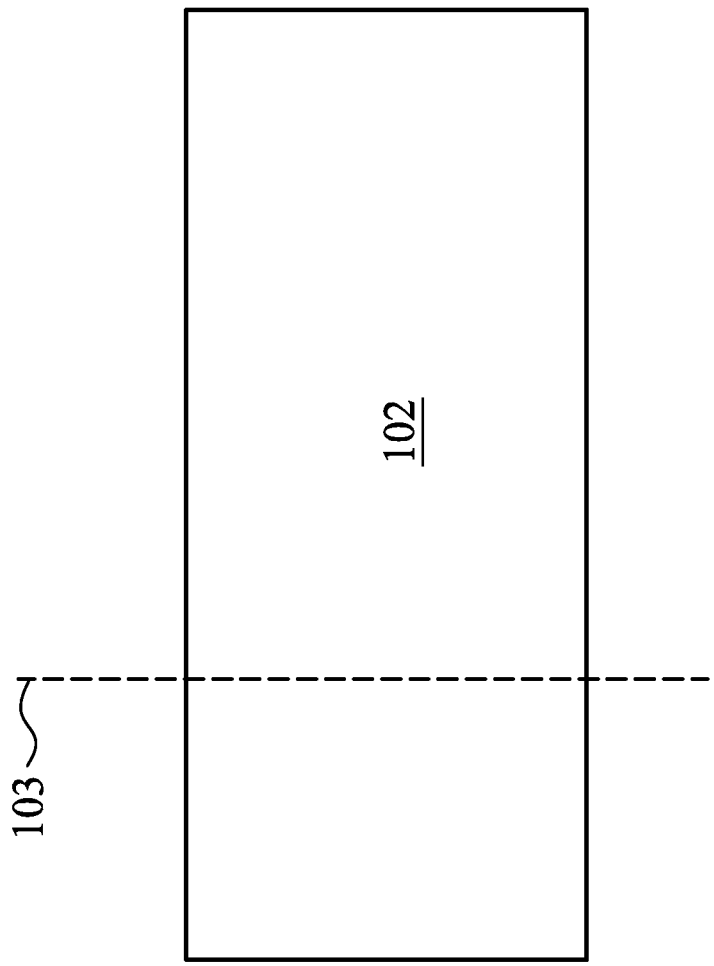

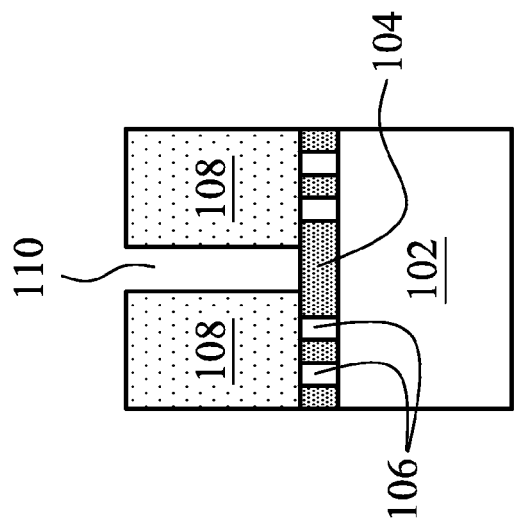
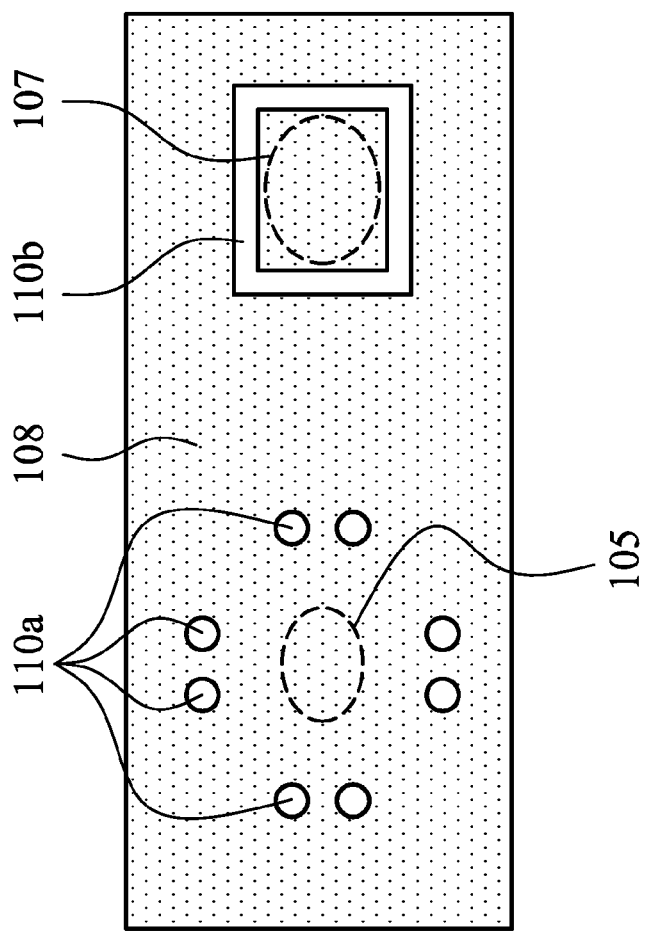
Fig. 5B
Fig. 5A

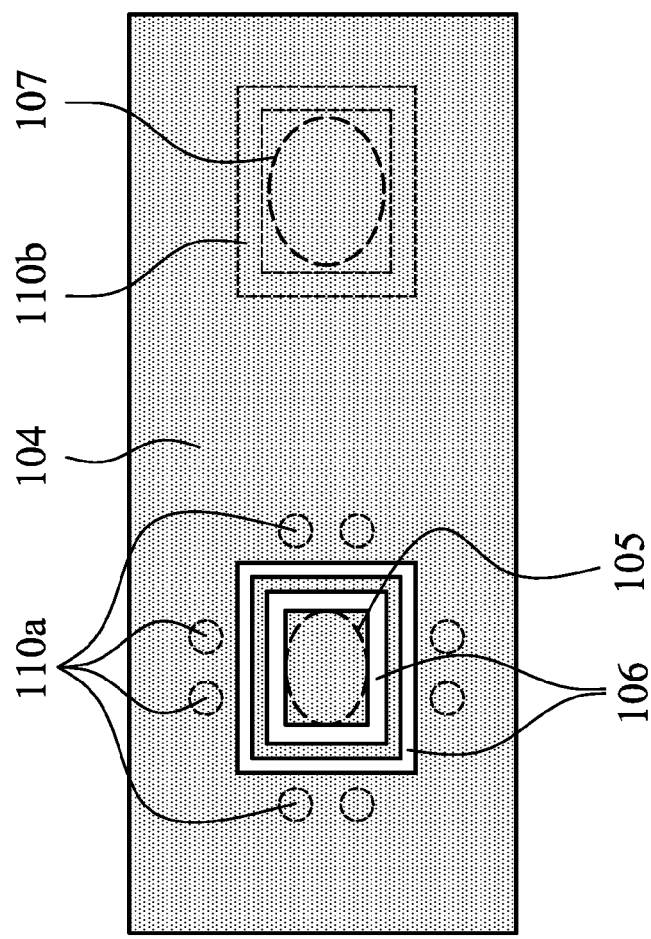
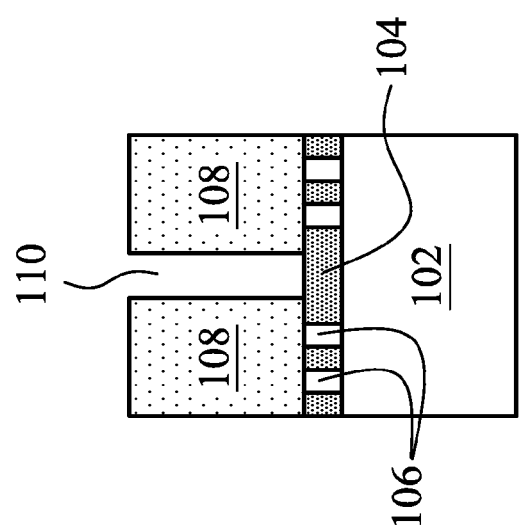
Fig. 6A
Fig. 6B

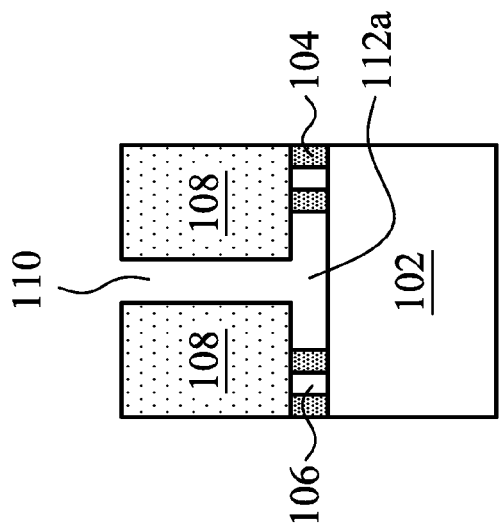
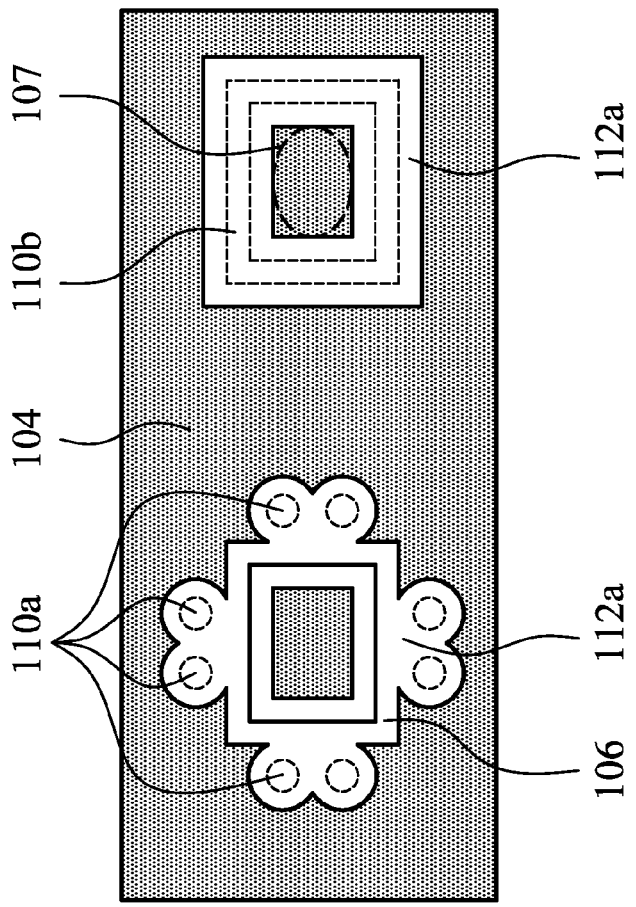
Fig. 7A
Fig. 7B

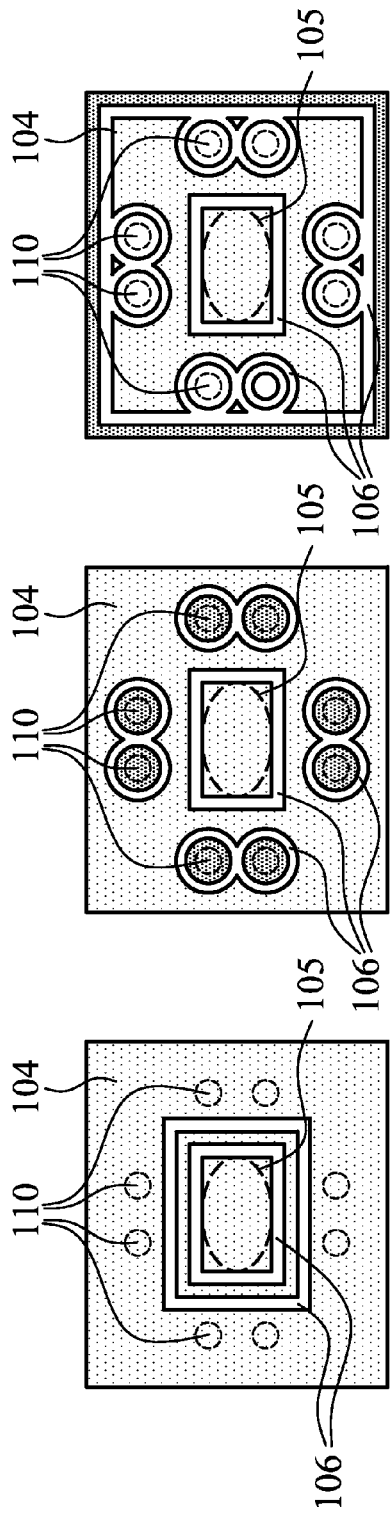

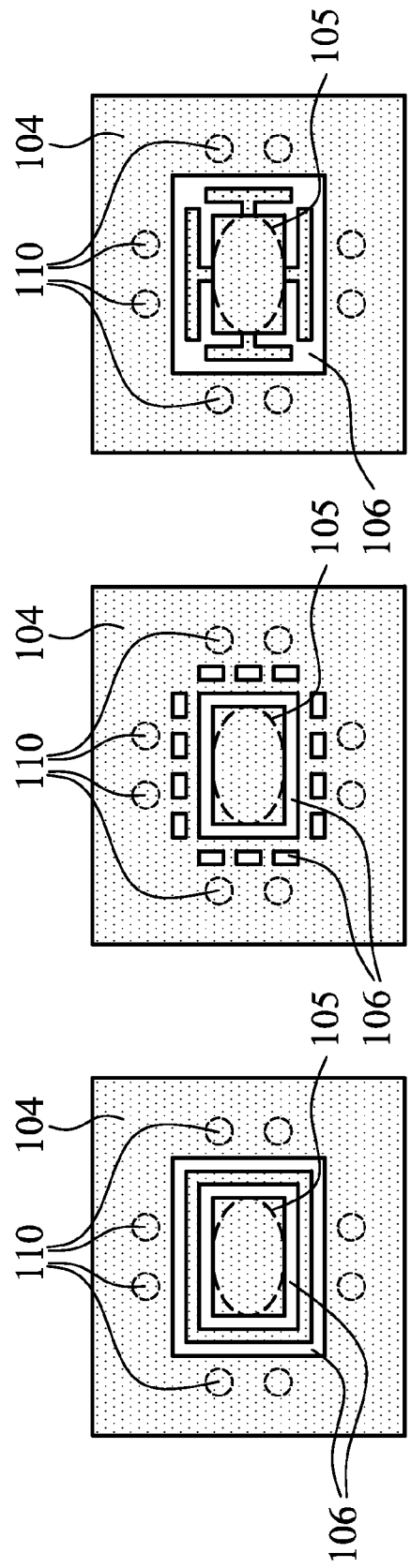

CAVITY STRUCTURE USING PATTERNED SACRIFICIAL LAYER

TECHNICAL FIELD

The present disclosure relates generally to an integrated circuit and more particularly a cavity structure using patterned sacrificial layer.

BACKGROUND

For some semiconductor devices, a cavity structure needs to be supported by an isolated anchor structure with precise dimensions. Some methods included using release holes for etching around the anchor structure. Etching time is determined by relative distance from release holes to anchors. Sometimes the release holes are limited to certain locations, which may lead to a longer process time or excessive undercut from etching at some sites. The shape of the anchor structure is easily affected by locations of the release holes.

BRIEF DESCRIPTION OF THE DRAWINGS

Reference is now made to the following descriptions taken in conjunction with the accompanying drawings, in which:

FIGS. 1A-8B are top and cross-section views of intermediate fabrication steps of an exemplary patterned cavity structure according to some embodiments;

FIGS. 9A-9E are top views of various exemplary patterned structure layouts according to some embodiments; and FIGS. 10A-10C are top views of various exemplary patterned structure layouts according to some embodiments.

DETAILED DESCRIPTION

Figures 2A, 2B:
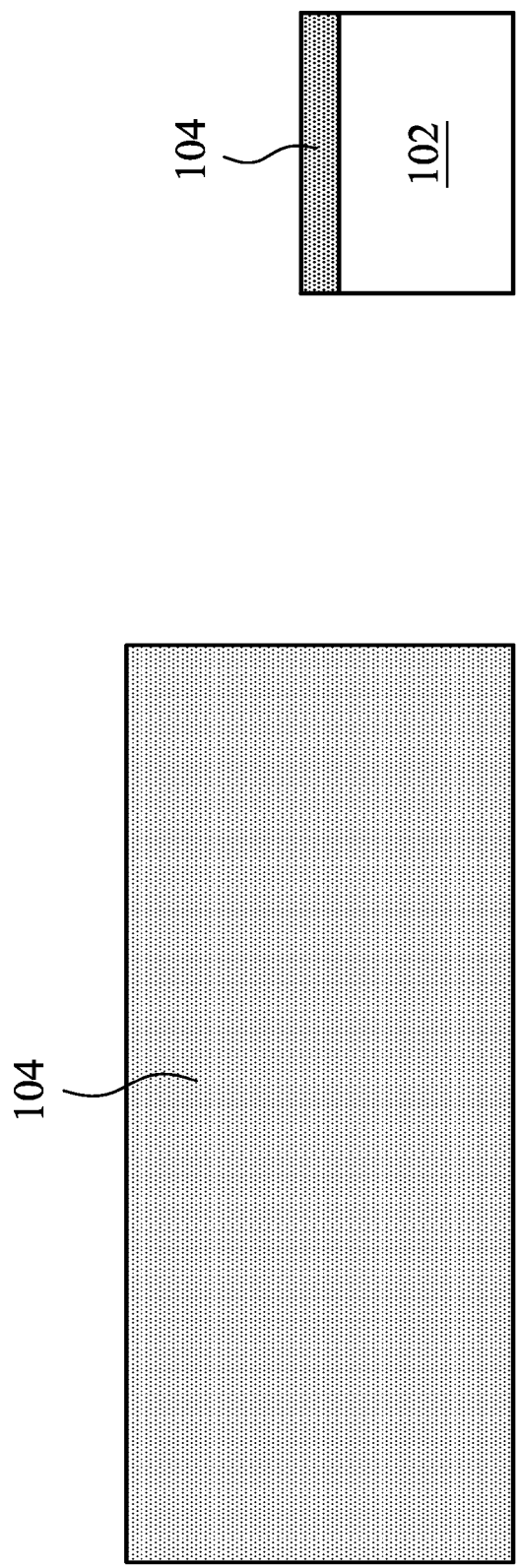

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-8B are top and cross-section views of intermediate fabrication steps of an exemplary patterned cavity structure according to some embodiments. FIG. 1A is a top view of a bottom substrate 102. FIG. 1B is a cross-section view of FIG. 1A along the line 103. The bottom substrate can comprise silicon, silicon dioxide, aluminum oxide, sapphire, germanium, gallium arsenide (GaAs), an alloy of silicon and germanium, indium phosphide (InP), silicon on insulator (SOI), or any other suitable material. In some embodiments, the bottom substrate 102 may have other structures including devices and components such as transistors, resistors, inductors, capacitors, etc. The following FIGS. 2A-8B are similarly arranged, each top view with a corresponding cross-section view.

In FIG. 2A, a sacrificial layer 104 is formed over the bottom substrate 102. In some embodiments, the sacrificial layer 104 comprises $SiO_2$, metal, polymer, or any other suitable material. In some embodiments, the thickness of the sacrificial layer 104 is in the range of 10 nm-100 µm. In one example, the sacrificial layer 104 comprising $SiO_2$ is deposited by chemical vapor deposition (CVD) or physical vapor deposition (PVD). FIG. 2B is a cross-section view of FIG. 2A.

Figure 3B:
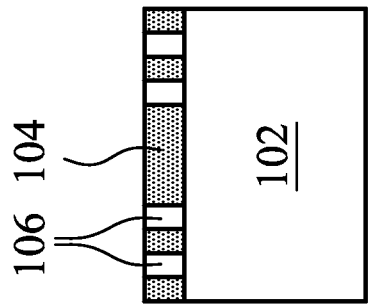
Figure 3A:
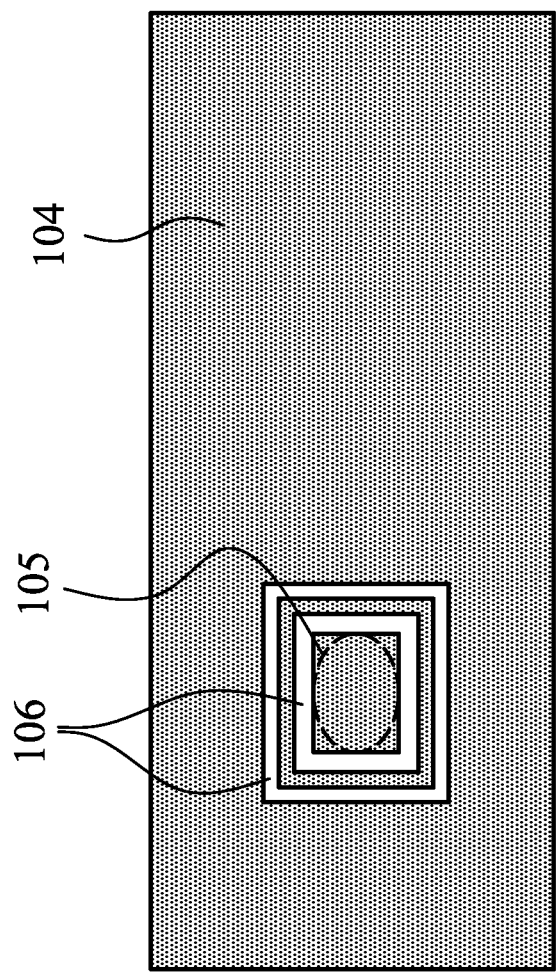

In FIG. 3A, the sacrificial layer 104 is patterned to make at least one channel or cavity 106 based on a desired etching distance. The sacrificial layer 104 will be etched later in the process (e.g., in FIG. 7A) and the etching distance depends on the specific process and etching time. The sacrificial layer 104 can be patterned by photolithography process and wet/dry etching, for example. One or more channel or cavity 106 is patterned around an anchor structure 105 in some embodiments. FIG. 3B is a cross-section view of FIG. 3A.

Figure 4B:
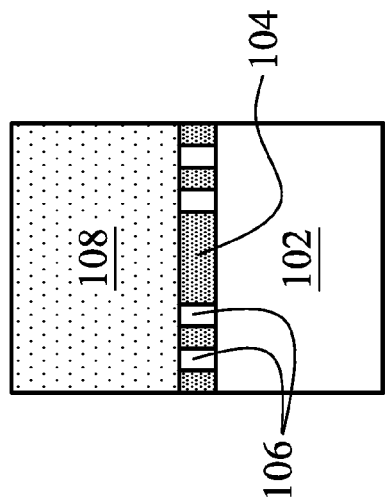
Figure 4A:
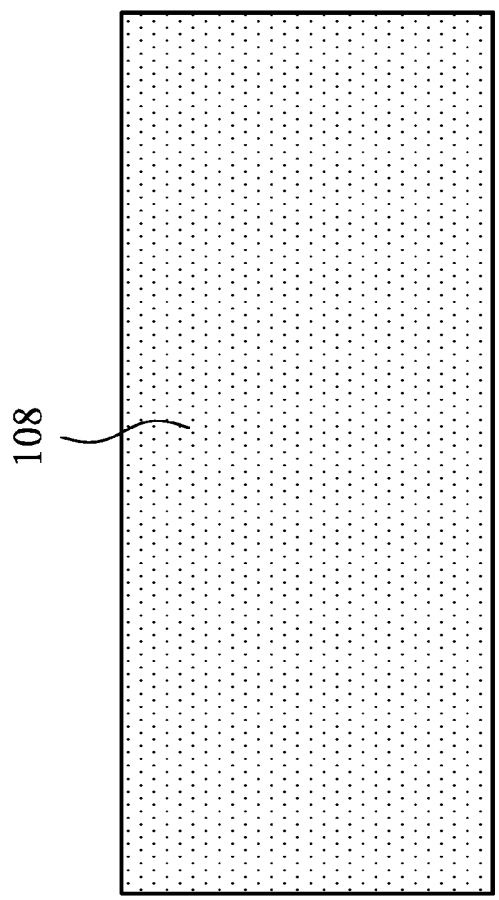

In FIG. 4A, a top layer 108 is formed over the sacrificial layer. In some embodiments, the top layer 108 comprises silicon. In some embodiments, the top layer 108 is formed by bonding a top substrate over the sacrificial layer 104, and the top substrate is bonded by fusion bonding or direct bonding. Any other suitable bonding method can be used. In some embodiments, the top layer 108 may have other structures including devices and components such as transistors, resistors, inductors, capacitors, etc. In some embodiments, the top layer 108 has a thickness ranging from 1 µm to 1000 µm.

In FIG. 5A, release holes 110a and 110b are formed through the top layer 108. In some embodiments, circular release holes 110a are distributed around the anchor structure 105. A release hole 110b is formed in the shape of a rectangular closed loop channel around another anchor structure 107. The illustrated release hole 110 of FIG. 5B does not correspond directly to either release holes 110a or 110b of FIG. 5A, but rather is intended to generically represent in a simplified fashion any and all release holes that are formed in top layer 108. Both anchor structures 105 and 107 are in the sacrificial layer 104. The release holes 110a and 110b can have different shapes, locations, and dimensions depending on the layout.

Figure 8B:
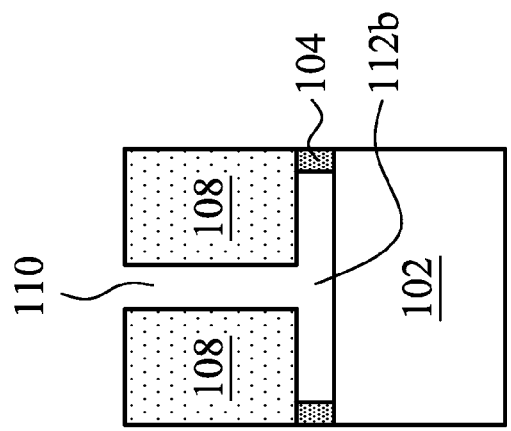
Figure 8A:
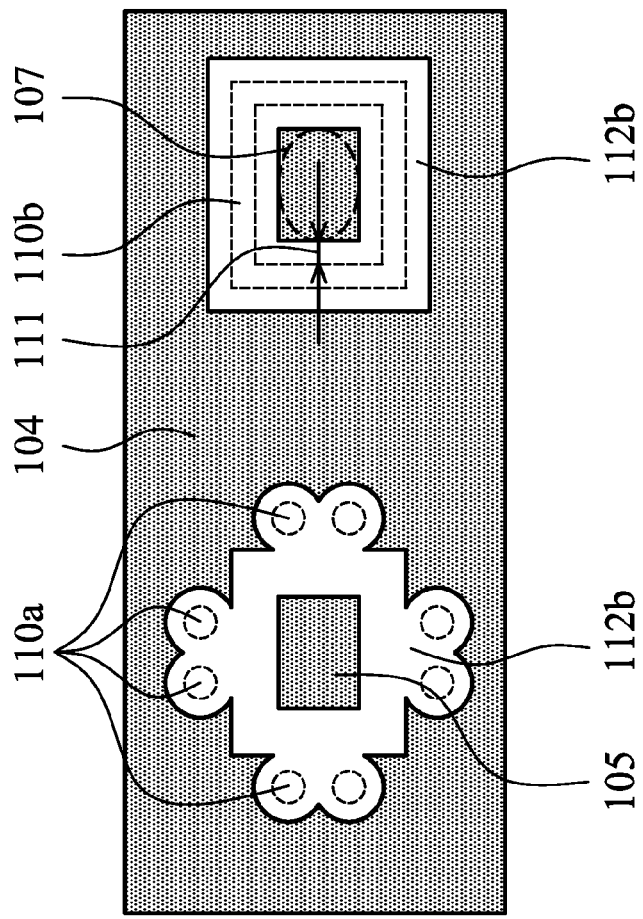

The release holes 110a and 110b, and the patterned channel/cavity 106 are designed according to the desired final structure of the sacrificial layer 104 in FIGS. 8A-8B. The release holes 110a and 110b can be formed by deep reactive-ion etching (DRIE), for example. In some embodiments, the release holes 110a and 110b have a width or diameter ranging from 1 µm to 100 µm.

FIG. 6A shows the locations of the release holes 110a and 110b relative to the sacrificial layer 104. The following FIGS. 7A-8B show the sacrificial layer 104 to illustrate how the etching process changes shapes in the sacrificial layer 104.

In FIG. 7A, the sacrificial layer 104 is etched through the release holes 110a and 110b and an etched out cavity area 112a is formed and enlarged. For example, dry etching, wet etching, or vapor etching process can be used. The pre-patterned sacrificial layer 104 structure in FIG. 6A with channel or cavity 106 reduces etching amount and allows better etching distance control, based on etching time and the specific etching process. The FIGS. 7A-7B illustrate the etched area 112a being enlarged from the release holes 110a and 110b by the etching process.

The patterned sacrificial layer 104 structure also provides the functionality of support and structural interconnection in locations that are not etched out. The anchor structure 105 in the sacrificial layer 104 provides structural support, for example.

In FIG. 8A, the etched out sacrificial layer 104 is shown with the cavity 112b formed from the etching process. The shape, distance, and speed of formation of the cavity 112b in FIG. 8A and FIG. 8B can be controlled by the location and size of the release holes 110a and 110b, the sacrificial layer 104 material, the size and shape of cavity(ies) 106, and selected etching time and method. The density of the channel or cavity 106 in the patterned sacrificial layer 104 structure in FIG. 6A can be uniform or non-uniform over a wafer depending on the desired etching speed and distance at different locations.

In some embodiments, the top layer 108 and the bottom substrate 102 can have electrical connections and routings separately or connected together by vias and/or metal layers comprising electrically conductive material such as metal, polysilicon, or any other suitable material.

By designing the pre-patterned channel/cavity 106 in the sacrificial layer 104 and the locations of the release holes 110a and 110b in the top layer 108, the etched structure of the sacrificial layer 104 in FIG. 8A has the desired etching distance and shape. For example, the anchor structure 105 is defined by generally straight lines with a rectangular shape, and an appropriate etching distance 111 around the anchor structure 107 is obtained without etching a longer (or larger) undercut than desired or planned.

In other embodiments, the anchor structure 105 may have a different shape such as circle, oval, or other polygon. Using the method described above, the anchor structure 105 will be defined by generally straight lines or generally smooth curves using pre-patterned sacrificial layer 104. In comparison, some other methods using release holes only will result in multiple arc shapes with sharp connecting points by etching at the multiple release holes, similar to the etched line 114.

The etching distance can be controlled with etching time of the specific etching process. In some other methods different from the method described above, while trying to obtain the desired etching distance around the anchor structure 105, the etched distance 111 around the anchor structure 107 can be greater than what is desirable, for example.

By using the method described with respect to FIGS. 1A-8B with the pre-patterned sacrificial layer 104 and the release holes 110a and 110b, the etched distance can be controlled better and the shape of the anchor structures 105 and 107 are less affected by the location of release holes 110a and 110b, compared to a different method using only the release holes 110a and 110b. Also, the different shapes and different numbers of channels/cavities 106 and release holes 110a/110b can be designed to obtain the final structure with a planned etching distance. Thus, the etching can be performed under relatively uniform conditions without the need to etch different distances at different locations.

FIGS. 9A-9E are top views of various exemplary patterned structure layouts according to some embodiments. The release holes 110 are distributed the same in FIGS. 9A-9E, but the channel or cavity 106 is patterned differently in the sacrificial layer 104. In FIG. 9A, two rectangular closed loop channels are formed around the anchor structure 105.

In FIG. 9B, one rectangular closed loop channel is formed around the anchor structure 105 and multiple circular channels are formed around the release holes 110. In FIG. 9C, the patterned channel or cavity 106 is similar to FIG. 9B, and an additional rectangular closed loop channel is formed around the outside of the release holes 110.

In FIG. 9D, the patterned channel or cavity 106 is similar to FIG. 9A, and additional cavities are formed at the release hole 110 locations. In FIG. 9E, the patterned channel or cavity 106 is similar to FIG. 9D, and an additional rectangular closed loop channel is formed connecting the release hole locations 110.

The locations, shapes, and dimensions of the patterned channel or cavity 106 in the sacrificial layer 104 can be designed to obtain the desired structure of the sacrificial layer 104 after the etching in FIGS. 7A-7B and reduce undesired under cut at different locations when the etching process is performed simultaneously.

Etching time can be controlled by the density of patterns (e.g., multiple parallel channels in FIG. 9A, or distributed circular channels in FIG. 9B) in addition to relative distance between release holes 110 and the anchor structure 105. The location of release holes 110 can be limited in the layout depending on the available chip area, but the sacrificial layer 104 can be patterned to save etching time and/or undesired undercut. This method is to not only reduce etching amount of sacrificial layer 104 by pre-patterning the sacrificial layer 104, but also guide the etchant to desired locations for etching.

FIGS. 10A-10C are top views of various exemplary patterned structure layouts according to some embodiments. The pattern of the channel or cavity 106 can be a closed loop or an open loop. The channels/cavities 106 in the sacrificial layer 104 can be a closed loop, an open loop, rectangular, circular, or any other shape. In FIG. 10A, the parallel channels 106 in the sacrificial layer 104 have a rectangular closed loop shape around the anchor structure 105.

In FIG. 10B, the two parallel channels 106 in the sacrificial layer 104 have different shapes, with a rectangular closed loop shape inside and a broken (open) loop shape outside. In FIG. 10C, the parallel channels 106 in the sacrificial layer 104 of FIG. 10A are connected at the corners of the rectangular shape and the inner channel has openings. Any suitable shape and pattern can be used in other embodiments.

According to some embodiments, a method includes forming a sacrificial layer over a bottom substrate. The sacrificial layer is patterned based on a desired etching distance. A top layer is formed over the sacrificial layer. At least one release hole is formed through the top layer. The sacrificial layer is etched through the at least one release hole.

According to some embodiments, an integrated circuit includes a bottom substrate and a sacrificial layer over the bottom substrate. The sacrificial layer includes at least one cavity and an anchor structure. A top layer is disposed over the sacrificial layer. The top layer includes at least one release hole formed through the top layer. The at least one release hole is used for etching the sacrificial layer to form the at least one cavity and the anchor structure, and the anchor structure is defined by generally straight lines or generally smooth curves.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
   forming a sacrificial layer over a bottom substrate;
   patterning the sacrificial layer to form at least one channel around a first anchor structure, wherein the first anchor structure is formed from a first portion of the sacrificial layer;
   after patterning the sacrificial layer, forming a top layer over the sacrificial layer;
   forming at least one release hole through the top layer; and
   etching the sacrificial layer through the at least one release hole, at least a portion of the first anchor structure remaining after the etching the sacrificial layer through the at least one release hole.

2. The method of claim 1, wherein the sacrificial layer is patterned by wet etching or dry etching.

3. The method of claim 1, wherein multiple release holes of the at least one release hole are distributed around the first anchor structure.

4. The method of claim 1, wherein the sacrificial layer is formed by chemical vapor deposition (CVD) or physical vapor deposition (PVD).

5. The method of claim 1, wherein the top layer is formed by bonding a top substrate over the sacrificial layer.

6. The method of claim 5, wherein the top substrate is bonded by fusion bonding.

7. The method of claim 1, wherein the sacrificial layer comprises $SiO_2$.

8. The method of claim 1, wherein the bottom substrate comprises silicon.

9. The method of claim 1, wherein the top layer comprises silicon.

10. A method, comprising:
    forming a sacrificial layer over a bottom substrate;
    patterning the sacrificial layer around an anchor structure in the sacrificial layer, wherein the anchor structure is formed from a portion of the sacrificial layer;
    after patterning the sacrificial layer, forming a top layer over and contacting the sacrificial layer;
    forming release holes through the top layer and distributed around the anchor structure; and
    after forming the release holes, etching the sacrificial layer through the release holes, at least a portion of the anchor structure remaining after the etching the sacrificial layer through the release holes.

11. The method of claim 10, wherein the sacrificial layer has at least one channel or cavity around the anchor structure.

12. The method of claim 10, wherein the sacrificial layer is formed by chemical vapor deposition (CVD) or physical vapor deposition (PVD).

13. The method of claim 10, wherein the top layer is formed by direct bonding a top substrate over the sacrificial layer.

14. The method of claim 10, wherein the sacrificial layer comprises $SiO_2$.

15. The method of claim 10, wherein the bottom substrate and the top layer comprise silicon.

16. A method comprising:
    depositing a sacrificial layer over a bottom substrate;
    removing at least one portion of the sacrificial layer surrounding an anchor structure;
    forming a top layer over the sacrificial layer;
    forming at least one release hole through the top layer; and
    etching the sacrificial layer through the at least one release hole to form at least one cavity surrounding the anchor structure in a plan view, wherein the anchor structure is defined by substantially straight lines or substantially smooth curves.

17. The method of claim 16, wherein the top layer is formed by direct bonding a top substrate over the sacrificial layer.

18. The method of claim 16, wherein depositing a sacrificial layer includes depositing silicon oxide using a chemical vapor deposition process or a physical vapor deposition process.

19. The method of claim 16, wherein the anchor structure is formed from a portion of the sacrificial layer.

20. The method of claim 1, further comprising:
    forming a closed loop channel in the top layer around a second anchor structure formed from a second portion of the sacrificial layer; and
    etching the sacrificial layer through the closed loop channel.

* * * * *